United States Patent
Mohan et al.

(10) Patent No.: US 7,180,382 B2
(45) Date of Patent: Feb. 20, 2007

(54) WIDE BAND VOLTAGE CONTROLLED CRYSTAL OSCILLATOR

(75) Inventors: Chandra Mohan, Carmel, IN (US); Kent Joseph Nysewander, Mooresville, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 96 days.

(21) Appl. No.: 10/478,448

(22) PCT Filed: May 15, 2002

(86) PCT No.: PCT/US02/15309

§ 371 (c)(1),
(2), (4) Date: Nov. 21, 2003

(87) PCT Pub. No.: WO02/095930

PCT Pub. Date: Nov. 28, 2002

(65) Prior Publication Data

US 2004/0130405 A1    Jul. 8, 2004

Related U.S. Application Data

(60) Provisional application No. 60/292,359, filed on May 21, 2001.

(51) Int. Cl.
*H03B 5/36* (2006.01)
(52) U.S. Cl. ............ 331/116 R; 331/158; 331/116 FE; 331/117 R; 331/177 V; 331/175; 331/162
(58) Field of Classification Search ................ 331/162, 331/158, 116 R, 116 FE, 177 R, 34, 117 FE, 331/117 R, 177 V, 175
See application file for complete search history.

(56) References Cited

U.S. PATENT DOCUMENTS 3,358,244 A    12/1967    Ho et al. ................ 331/116

(Continued)

FOREIGN PATENT DOCUMENTS

EP    0 278 613    8/1988

(Continued)

OTHER PUBLICATIONS

Search Report *.

*Primary Examiner*—Michael B Shingleton
(74) *Attorney, Agent, or Firm*—Joseph J. Laks; Robert B. Levy; Joseph J. Kolodka (57) ABSTRACT

A voltage controlled Colpitts type crystal oscillator includes a first crystal and a transistor coupled to the first crystal to provide positive feedback for generating an output oscillatory signal. A variable capacitance is coupled to the first crystal for producing a change in a frequency of the oscillatory signal when a corresponding change in the variable capacitance occurs. A first inductance is coupled in a resonant circuit that includes the variable capacitance and the first crystal having a value selected to provide a pulling range of at least 0.4% with respect to the frequency of the oscillatory signal. In one embodiment of the invention, a second crystal is coupled to the first crystal and included in the resonant circuit. An energy dissipating impedance is coupled in the resonant circuit to the first crystal for decreasing a Q characteristic of the first crystal to increase the pulling range of the oscillator. The first inductance separates the second crystal from each of the first crystal and the energy dissipating impedance to decrease an effect of the energy dissipating impedance on a Q characteristic of the second crystal.

9 Claims, 7 Drawing Sheets

U.S. PATENT DOCUMENTS

| | | | |
|---|---|---|---|
| 3,477,039 A | * | 11/1969 | Chan ..................... 331/116 FE |
| 3,569,865 A | * | 3/1971 | Healey, III .............. 331/116 R |
| 3,763,440 A | * | 10/1973 | Garcia et al. ................. 331/66 |
| 3,995,233 A | * | 11/1976 | Waku ..................... 331/116 R |
| 4,063,194 A | * | 12/1977 | Helle ........................ 331/162 |
| 4,193,046 A | * | 3/1980 | Chiba ........................ 331/109 |
| 4,843,349 A | * | 6/1989 | Nugent et al. .......... 331/116 R |
| 4,851,790 A | | 7/1989 | Driscoll .................. 331/116 R |
| 5,229,735 A | | 7/1993 | Quan ..................... 331/116 R |
| 6,172,574 B1 | * | 1/2001 | Sirito-Olivier .......... 331/116 R |
| 2004/0130405 A1 | * | 7/2004 | Mohan et al. .............. 331/158 |

FOREIGN PATENT DOCUMENTS

| JP | 55110981 | 8/1980 |
|---|---|---|
| JP | 59117304 | 7/1984 |

* cited by examiner

WIDE BAND VOLTAGE CONTROLLED CRYSTAL OSCILLATOR

This application claims the benefit under 35 U.S.C. § 365 of International Application PCT/US02/15309 filed May 15, 2002, which claims the benefit of United States Provisional Application No. 60/292,359 filed May 21, 2001.

FIELD OF THE INVENTION

The present invention relates to crystal oscillators and, more particularly, to voltage controlled crystal oscillators.

BACKGROUND OF THE INVENTION

Crystal oscillators or crystal oscillator circuits are well known in the art. One characteristic of crystal oscillators is their ability to provide extremely stable operation. As such, crystal oscillator circuits are best known for their extremely stable operation. Additionally, crystal oscillators advantageously provide low phase noise performance. Further, crystal oscillators are low cost, with high Q crystals of small size. A disadvantage, however, with respect to current crystal oscillators is their inability to provide wide band operation (i.e. they have a small pulling range).

The present invention relates to a type of crystal oscillator of which the frequency may be controlled by an electrical voltage, which enables the operating frequency of the oscillator to be freely selected within a given band of frequencies. The given band of frequencies is typically defined by the oscillator and/or oscillator component(s). This type of crystal oscillator is known as a voltage controlled crystal oscillator (VCXO).

The range of operating frequencies for a VCXO may be termed the band or tuning range of operating frequencies. A VCXO typically has a center frequency of operation with the upper (maximum) and lower (minimum) frequency of operation being the pulling range of the VCXO. A problem is that traditional voltage controlled crystal oscillators cannot be pulled by an amount greater than about 0.05% (e.g. +/−2.5 KHz pulling on a 10 MHz crystal).

What is therefore needed is a voltage controlled crystal oscillator that provides a pulling range that is greater than the prior art.

SUMMARY OF THE INVENTION

The subject invention is a voltage controlled crystal oscillator (VCXO). Single or dual crystals are separately tuned with inductance and/or capacitance to provide a wide pulling range. The subject VCXOs provide stable frequency output over wide pulling ranges, typically better that 1.2% of the nominal resonant frequency thereof.

In accordance with one form of the subject invention, there is provided a voltage controlled crystal oscillator. The voltage controlled crystal oscillator includes a first crystal, a second crystal disposed in parallel with the first crystal, a first reactance associated with the first crystal, a second reactance associated with the second crystal, and transistor circuitry in communication with the first and second crystals and operative to output an oscillatory signal.

In accordance with another form of the subject invention there is provided a voltage controlled crystal oscillator. The voltage controlled crystal oscillator includes crystal resonator means having a first crystal and a second crystal disposed in parallel for providing a crystal oscillation signal, first reactance means associated with the first crystal for tuning the first crystal, second reactance means associated with the second crystal for tuning the second crystal, and transistor means in communication with the crystal resonator means for outputting an oscillatory signal in response to the crystal oscillation signal.

In accordance with yet another form of the subject invention there is provided a method of generating an oscillatory signal comprising the steps of: (a) providing a crystal resonator structure having a first crystal and a second crystal disposed in parallel, (b) providing a first reactance associated with said first crystal, (c) providing a second reactance associated with said second crystal, (d) generating a crystal oscillation signal from said crystal resonator structure and said first and second reactances, and (e) providing transistor circuitry in communication with said crystal resonator structure, said transistor circuitry operative to output an oscillatory signal in response to said crystal oscillation signal.

Without being limiting, the subject invention has application in spread spectrum communication systems employing impulse transmissions (e.g. time domain spread spectrum, frequency hopping spread spectrum, and direct sequence spread spectrum systems) for faster and easier tracking and acquisition of spread spectrum codes. Again, without being limiting, this technique can also be adopted/adapted for clock recovery in SONET, ATM, and/or ETHERNET based systems. Further, while the various embodiments of the subject invention are disclosed with respect to a Colpitts type oscillator, it should be appreciated that the subject invention applies to other types of oscillators such as Pierce oscillators, Clapp oscillators, Hartley oscillators, and/or the like.

BRIEF DESCRIPTION OF THE DRAWINGS

The above-mentioned and other features and advantages of this invention, and the manner of attaining them, will become more apparent and the invention will be better understood by reference to the following description of an exemplary embodiment of the invention taken in conjunction with the accompanying drawings, wherein.

Corresponding reference characters indicate corresponding parts throughout the several views.

DETAILED DESCRIPTION

Figure 1:
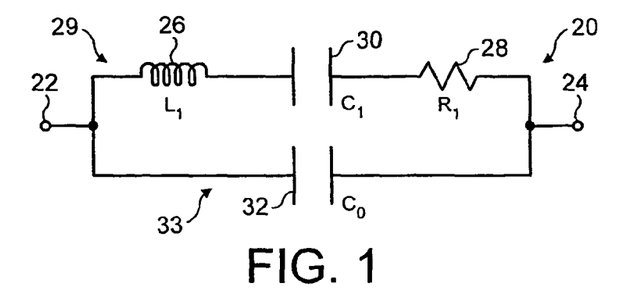
FIG. 1 depicts an electrical model of a quartz crystal.

An equivalent electrical circuit for a quartz crystal, generally designated 20, is shown in FIG. 1 and reference is made thereto. The equivalent electrical circuit for a quartz crystal 20 has a first terminal 22 and a second terminal 24.

Particularly, the equivalent electrical circuit for a quartz crystal 20 has inductance (that may be termed "motional inductance") represented by an inductor 26, capacitance (that may be termed "motional capacitance") represented by a capacitor 30, and resistance represented by a resistor 28 (a mechanical loss representative by a resistor 28). The inductor 26, capacitor 30, and the resistor 28 comprise the series components. The equivalent electrical circuit for quartz crystal 20 also has a shunt capacitance represented by the capacitor 32. The shunt capacitance 32 is defined as the sum of the electrode capacitance and the holder (i.e. the case containing the crystal) capacitance. The shunt capacitance is of importance in getting the crystal to work above the series resonant frequency. The capacitor 32 comprises a parallel component. The capacitor 32 is thus coupled in parallel with the series components.

For ease of presenting various formulas and/or identities, the inductor 26 may be represented by $L_1$, the motional capacitance 30 may be represented by $C_1$, the resistor 28 may be represented by $R_1$, and the shunt capacitor 32 may be represented by $C_0$.

There are two possible modes of operation of the quartz crystal (equivalent electrical circuit for a quartz crystal) 20: a series resonance mode and a parallel resonance mode. The frequency of oscillation and related parameters for the quartz crystal 20 are given by the following equations, labeled equations (1), (2), and (3).

Particularly, series resonance (i.e. the series resonant frequency) $f_s$ of the crystal 20 is given by equation (1) as:

$$f_s \text{ (series resonance)} = 1/(2\pi(L_1 C_1)^{1/2}) \quad (1).$$

The series resonant point is the point of minimum impedance. Stated another way, the lowest crystal impedance exists at the series resonant frequency.

The parallel resonance point (i.e. the parallel resonant frequency) $f_p$ of the crystal 20 is the point of maximum impedance. Stated another way, the largest crystal impedance exists at the parallel resonant frequency. Parallel resonance is given by equation (2) below. Equations (3) and (4) are provided as well. Particularly, the parallel resonant frequency $f_p$ is given by equation (2) as:

$$f_p \text{ (parallel resonance)} = 1/(2\pi(L_1 C_{eq})^{1/2}) \quad (2),$$

where $$C_{eq} = (C_1 C_0)/(C_1 + C_0);$$

and $$Q \text{ (quality factor)} = (2\pi f_s L_1)/R_1 = 1/(2\pi f_s C_0 R_1) \quad (3)$$

A crystal that may be used for parallel mode operation can be used in series mode operation by using a specified load capacitance (not shown) in series with the crystal 20 (rather then a specified load capacitance in parallel with the crystal 20, not shown). The resonance frequency of the crystal 20 can be adjusted slightly by adding either parallel or series trimming capacitance (capacitor(s)) as appropriate.

Figure 2:
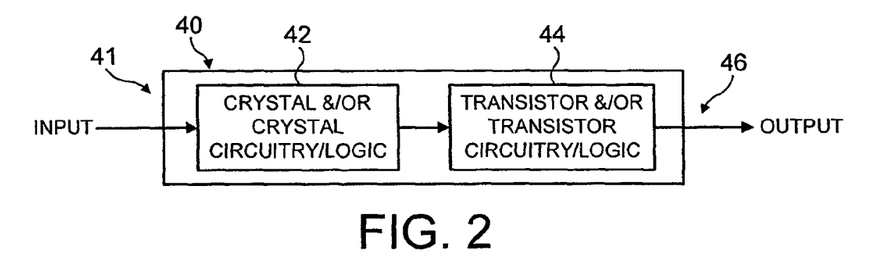
FIG. 2 depicts a block diagram of an exemplary voltage controlled crystal oscillator in accordance with the principles of the subject invention.

Referring now to FIG. 2, there is depicted a block diagram of a voltage controlled crystal oscillator (VCXO), generally designated 40, in accordance with the principles of the subject invention as discussed herein. The VCXO 40 has an input 41 and an output 46. The input 41 is representative of both a physical terminal or the like and an input signal developed at the physical terminal. The input 41 is in communication with crystal circuitry 42. The crystal circuitry 42 is operative to provide a resonator structure. The crystal circuitry 42 is coupled to transistor circuitry 44. The transistor circuitry 44 is operative to provide an oscillator structure. The crystal circuitry 42 provides a resonant input for the transistor circuitry 44. In one form, the oscillator structure is a Colpitts oscillator and, more particularly, a variation of a standard Colpitts oscillator. It should be appreciated, however, that the subject invention may be utilized with other types of oscillator configurations. An output 46 is coupled to the transistor circuitry 44. The output 46 is representative of both a physical terminal or the like and an oscillator output signal developed at the physical terminal.

Figure 3:
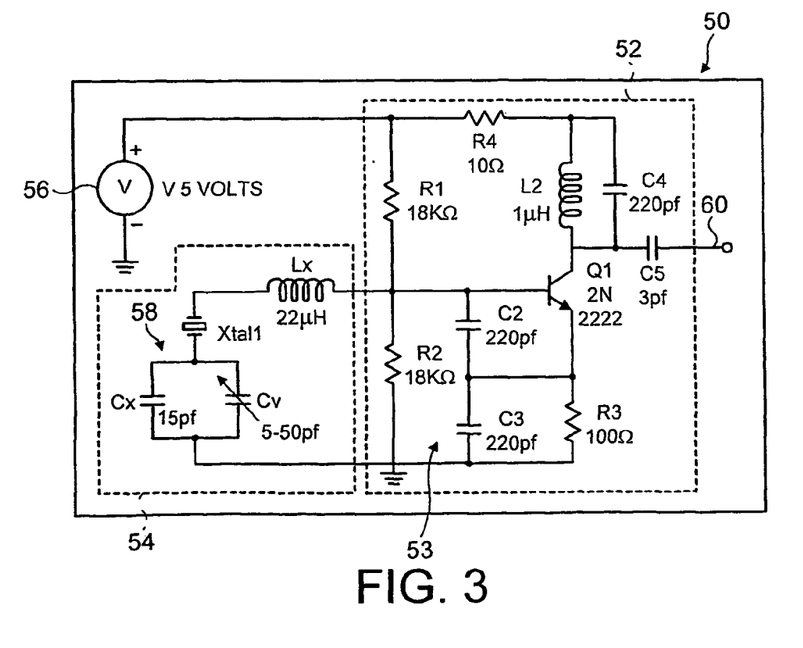
FIG. 3 is an electrical schematic diagram of an exemplary embodiment of a single crystal voltage controlled crystal oscillator in accordance with the principles of the subject invention.

Referring now to FIG. 3, there is depicted an electrical schematic of an exemplary single crystal VCXO embodiment generally designated 50 in accordance with the present principles. The VCXO 50 includes transistor circuitry 52 in like manner to transistor circuitry 44. The transistor circuitry 52 forms a modified Colpitts oscillator and has an output 60 in like manner to the output 24. The VCXO 50 also includes crystal circuitry 54 in like manner to the crystal circuitry 42. The crystal circuitry 54 is coupled to the transistor circuitry 52. A voltage source 56 is coupled to the transistor circuitry 52.

Particularly, the transistor circuitry 52 includes an NPN transistor Q1 having a feed back loop 53 that includes a voltage divider formed by capacitors C2 and C3 of selectable capacitance. Particularly, the capacitor C2 is coupled between the base of the transistor Q1 and the emitter of the transistor Q1, while the capacitor C3 is coupled between the emitter of the transistor Q1 and ground. The feedback loop 53 provides enough feedback to the transistor Q1 to maintain oscillation. Emitter resistance R3 is provided between ground and the junction or node between the capacitors C2 and C3. The emitter resistor R3 is also coupled to the emitter of the transistor Q1.

The transistor circuitry 52 also includes biasing resistance for the controlling the operating point of the transistor Q1. In the VCXO 50 of FIG. 3, biasing resistance is in the form of resistors R1 and R2. The resistor R1 is coupled between the voltage source 56 and the base of the transistor Q1. The resistor R2 is coupled between the base of the transistor Q1 and the resistor R1 at one junction or node, and ground. The output 60 is capacitively coupled by a capacitor C5 that is coupled to the collector of the transistor Q1. Additionally, a tank circuit such as an LC circuit embodied as inductor L2 and capacitor C4, is coupled to the collector of the transistor Q1 and the output 60 (capacitor C5).

Particularly, the crystal circuitry 54 includes a crystal Xtal1 (preferably a quartz crystal) that is coupled to inductor Lx (inductance) at one end thereof, and to variable capacitance 58 embodied in VCXO 50 as a parallel configuration of a first, fixed capacitance or capacitor Cx and a second, variable capacitance or capacitor Cv. The capacitors Cx and Cv are coupled to ground. The inductor or inductance Lx is provided in the crystal circuitry 54 and couples the crystal Xtal1 to the base of the transistor Q1.

The crystal Xtal1, like all crystals, has a fundamental frequency. This fundamental frequency of the crystal coupled with the inductance Lx provides tuning or pulling of the crystal. By utilizing the electrical characteristics of the crystal with a selected inductance (e.g., Lx) and capacitance (e.g. Cx and/or Cv), one of which is voltage variable, pulls the crystal. In the embodiment of FIG. 3, capacitance Cv is variable and can be implemented by using a semi-conductor junction, the semi-conductor junction effective as a variable capacitor. Such a junction can provide varying capacitance with varying input voltage. This variable capacitance operates as a varactor.

Figure 7:
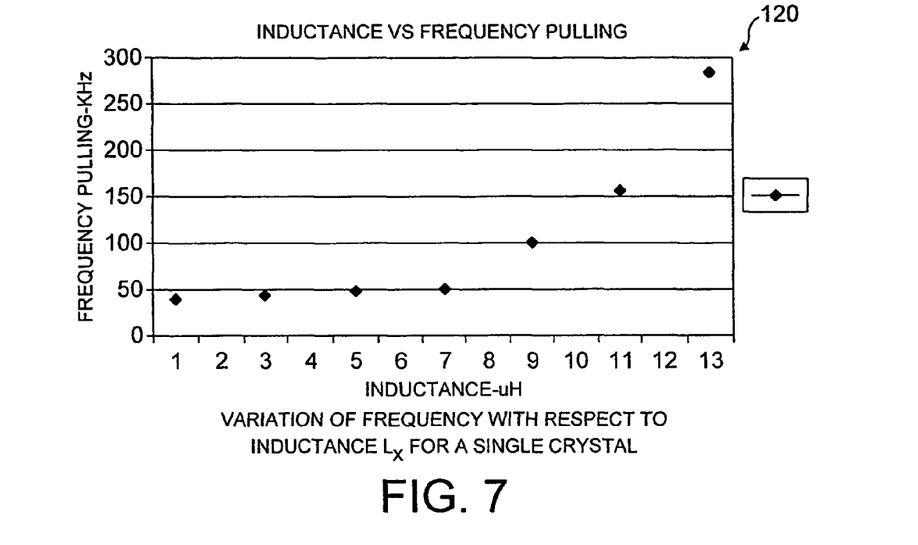
FIG. 7 is a graph depicting inductance versus frequency pulling for a single crystal voltage controlled crystal oscillator.

Lx provides a function of providing the tuning of the crystal through resonance with the capacitor value. Value selection of the inductance is thus necessary. With respect to FIG. 7, showing a graph depicting inductance versus frequency pulling for the single crystal voltage controlled crystal oscillator of FIG. 3. It can be seen in FIG. 7, that inductor Lx (or inductance) provides a 50 kHz pulling at 10.7 MHz for values of Lx less than 7 uH, and, for example, up to approximately 300 kHz pulling at 10.7 MHz for higher values (up to 33 uH) thereof. This provides a pulling range of 2.8%. The present invention provides a pulling of a minimum of 50 kHz or 0.46% without sacrificing tuning linearity (better than 2%) and single side band (SSB) Phase noise variation over the tuning range (better than 6 dbc/hz over the entire tuning range).

With respect to the VCXO 50, if the reactance of the crystal Xtal1 ($X_e$) and the reactance of the circuit (X) satisfy the following relationship, then oscillation will occur.

$$X_e = -X \text{ i.e. } R_e = -R \quad (4)$$

Equation (4) represents a worst case operating condition for starting up the oscillator. Under typical and preferred operating conditions, the following relationship is valid:

$$-R > R_e \quad (5)$$

With respect to the VCXO 50 of FIG. 3:

$$-R = -g_m/(\omega^2 C_2 C_3) \quad (6)$$

where $g_m$ is the mutual conductance of the transistor Q1 and ω is the angular frequency of oscillation of the transistor Q1. The capacitance C2 and C3 are chosen for appropriate operation as desired and can be evaluated for known values of R, $g_m$, and ω. The biasing resistors R1 and R2 are chosen for appropriate operation as desired and can be chosen to provide the desired operating point of the transistor Q1. The capacitors Cx and Cv in the circuit 54, together with the motional capacitance of the crystal Xtal1 or oscillator will control the pulling range of the circuit. If the resonance frequency with a load capacitance (i.e. $C_x$, $C_v$) is $f_l$, then the difference between $f_l$ and $f_s$ (frequency pulling) (neglecting inductance at the present) is given by:

$$\Delta f/f_s = (f_l - f_s)/f_s = [\tfrac{1}{2}(C_0/C_1)] \, [1/(1+(C_L/C_o))] \quad (7),$$

where $$C_L = [(1/C_2) + (1/C_3) + (1/(C_x + C_v))]^{-1} \quad (8).$$

According to one aspect of the subject invention, the VCXO 50 thus includes inductance, represented in the crystal circuitry 54 by the inductor Lx. As indicated above, inductance (i.e. inductor Lx) can increase the pulling range of the crystal circuitry 54 and thus the VCXO 50. In particular, the pulling range may now be represented mathematically by:

$$\Delta f/f_s = (f_l - f_s)/f_s = [\tfrac{1}{2}(C_0/C_1)] \, [1/(1+(C_L/C_o)) \\ (1/(1-\omega^2 L_x C_L))] \quad (9).$$

Figure 4:
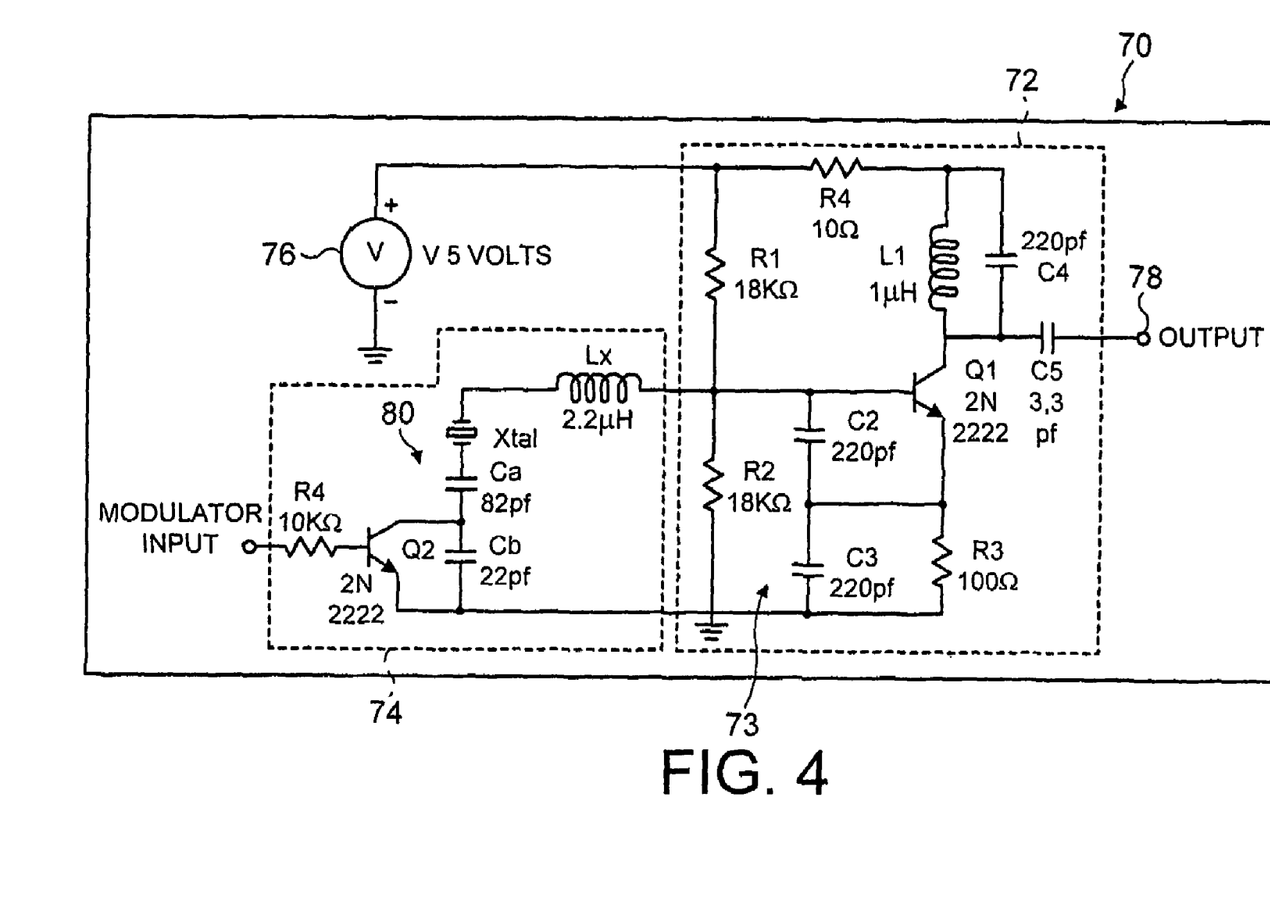
FIG. 4 is an electrical schematic diagram depicting the methodology for adding capacitance to a tank circuit portion of a single crystal voltage controlled crystal oscillator in accordance with the principles of the subject invention.

Referring to FIG. 4, there is depicted an electrical schematic of an exemplary alternative embodiment of a VCXO, here generally designated 70. The VCXO 70 includes transistor circuitry 72 in like manner to transistor circuitry 44. The transistor circuitry 72 forms a modified Colpitts oscillator and has an output 78 in like manner to the output 24. The VCXO 70 also includes crystal circuitry 74 in like manner to the crystal circuitry 42. The crystal circuitry 74 is coupled to the transistor circuitry 72. A voltage source 76 is coupled to the transistor circuitry 72.

Particularly, the transistor circuitry 72 includes an NPN transistor Q1 having a feed back loop 73 that includes a voltage divider formed by capacitors C2 and C3 of selectable capacitances. Particularly, the capacitor C2 is coupled between the base of the transistor Q1 and the emitter of the transistor Q1, while the capacitor C3 is coupled between the emitter of the transistor Q1 and ground. The feedback loop 73 provides enough feedback to the transistor Q1 to sustain oscillation. Emitter resistance R3 is provided between ground and the junction or node between the capacitors C2 and C3. The emitter resistor R3 is also coupled to the emitter of the transistor Q1.

The transistor circuitry 72 also includes biasing resistance for the controlling the operating point of the transistor Q1. In the VCXO 70 of FIG. 4, biasing resistance is in the form of resistors R1 and R2. The resistor R1 is coupled between the voltage source 76 and the base of the transistor Q1. The resistor R2 is coupled between the base of the transistor Q1 and the resistor R1 at one junction or node, and ground. The output 78 is capacitively coupled by a capacitor C5 that is coupled to the collector of the transistor Q1. Additionally, a tank circuit such as an LC circuit embodied as inductor L1 and capacitor C4, is coupled to the collector of the transistor Q1 and the output 78 (capacitor C5).

Particularly, the crystal circuitry 74 includes a crystal Xtal1 (preferably a quartz crystal) that is coupled at one end thereof to inductance (inductor Lx) that is coupled to the base of the transistor Q1, and to variable capacitance 80 embodied in the crystal circuitry 74 as a series configuration of a first, fixed capacitance or capacitor Ca and a second, fixed capacitance or capacitor Cb that can be selectively switched into and out of series coupling with the capacitor Ca. The capacitor Cb is coupled to ground and between the collector and emitter of a transistor (switch) Q2. In this manner, the capacitor Cb can be switched on and/or off by the transistor Q2. When the transistor Q2 is turned off by an input signal (e.g. modulated input) applied to the base of the transistor Q2, the variable capacitance becomes the series equivalent of the capacitors Ca and Cb. When the transistor Q2 is turned on through the input signal (e.g. modulated input) applied to the base of the transistor Q2, the variable capacitance becomes the capacitor Ca. Modulation may then be applied at the input of the transistor Q2, thereby making the oscillator a Frequency Shift Keying (FSK) type modulator or low power transmitter.

It should be appreciated that the inductance Lx (inductance) of FIG. 4 performs in the same or similar manner as the inductance (inductor Lx) of FIG. 3. In FIG. 4, with the values as provided, the VCXO 70 provides a maximum frequency of 10.625 MHz and a minimum frequency of 10.618 MHZ at a power output of −9 dbm .

With respect to Equation (3) above and the VCXO 70 of FIG. 4, capacitance now becomes:

$$C_L = [(1/C_2) + (1/C_3) + (1/C_X)]^{-1}$$

where $C_X$ is a function of $C_a$, $C_b$, and the transistor Q2 output capacitance $C_{ce}$. When the transistor Q2 is fully on, $C_X = C_a$. When the transistor Q2 is off $C_X$ becomes:

$$C_X = [(1/C_a) + (1/(C_b + C_{ce}))]^{-1} = [(1/C_a) + (1/C_b)]^{-1} \text{ if } C_b >> C_{ce} \quad (10).$$

The frequency shift can be properly controlled by appropriate selection of $C_a$, $C_b$.

Figure 5:
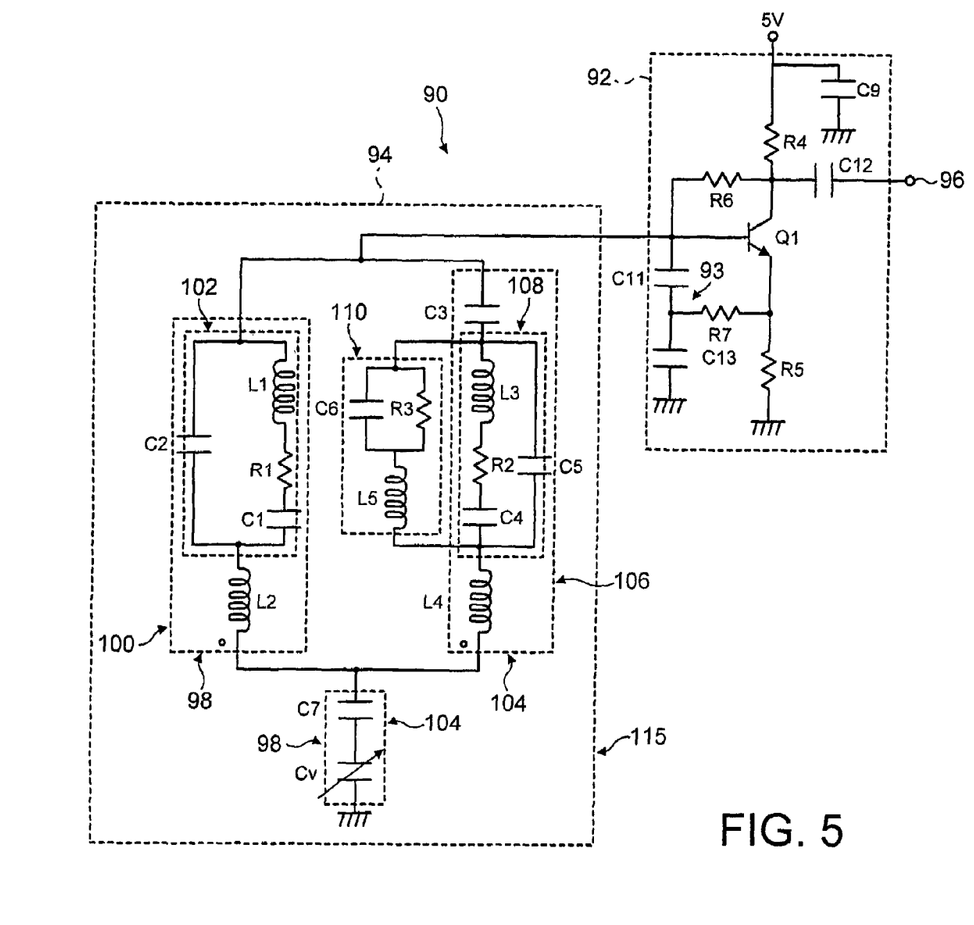
FIG. 5 is an electrical schematic diagram of an exemplary embodiment of a dual or twin crystal voltage controlled crystal oscillator in accordance with the principles of the subject invention.

Referring now to FIG. 5, there is depicted an electrical schematic of an exemplary and basic VCXO generally designated 90. The VCXO 90 includes transistor circuitry 92 in like manner to transistor circuitry 44. The transistor circuitry 92 forms a modified Colpitts oscillator and has an output 96 in like manner to the output 24. The VCXO 90 also includes crystal circuitry 94 in like manner to the crystal circuitry 42. The crystal circuitry 94 is coupled to the transistor circuitry 92. A voltage source of five (5) volts is coupled to the transistor circuitry 92.

In one form, the transistor circuitry 92 includes an NPN transistor Q1 and a feed back loop 93 that includes a voltage divider formed by capacitors C11 and C13. Particularly, the capacitors C11 and C13 are coupled in series such that capacitor C11 is coupled to the base of the transistor Q1 and the capacitor C13 is coupled to ground. A resistance R7 is provided between the junction or node of the capacitors C11 and C13. An emitter resistance R5 is coupled to the resistor R7 and to the emitter of the transistor Q1 and is also coupled to ground. Change in values of the capacitors C11 and/or C13 provide different operating characteristics. The capacitors C11 and/or C13 may thus be used for tuning the VCXO 90.

The output 96 is capacitively coupled by a capacitor C12 that is coupled to the collector of the transistor Q1. Additionally, a filter such as an RC circuit embodied as resistor R4 and/or resistor R6 and capacitor C9, is coupled to the collector of the transistor Q1 and to the base of the transistor Q1.

Particularly, the crystal circuitry 94 includes dual or twin crystals. More particularly, the crystal circuitry 94 includes a first resonant structure 98 having a first resonant substructure 100, and a second resonant structure 104 having a second resonant substructure 106. The first resonant substructure 100 includes a first crystal 102 represented by its electrical schematic equivalent. The second resonant substructure 106 includes a second crystal 108, represented by its electrical schematic equivalent. The second resonant substructure 106 may have an additional or "de-Q'ing" network or circuitry 110 (here shown as capacitor C6 in parallel with a resistor R3, the whole being in series with an inductor L5). The first resonant structure 100 includes an inductance (inductor) L2 in series with the crystal 102 while the second resonant structure 104 includes an inductance (inductor) L4 in series with the crystal 108. The inductors L2 and L4 are coupled together at a node with a fixed capacitor C7. The capacitor C7 is coupled in series with a variable capacitor Cv. The additional circuitry 110 provides linearization of the tuning response of the second resonant structure 104. This is accomplished by reducing the "Q" or de-Q'ing the crystal. Particularly, changes in capacitance Cv causes the resonant frequency of the second resonant structure 104 to be linear or more linear. Stated another way, a change in a voltage, not shown, that varies the value of capacitance Cv creates a proportional (linear) change in the oscillator frequency (Δf).

Variation in the inductance L2 provides tuning of the resonant structure 100/crystal 102 while variation in the inductance L4 provides tuning of the resonant structure 104/crystal 108. Additionally, variations in the fixed capacitor value and tunability of the variable capacitor, provide changes in the pulling range of the VCXO.

The first and second resonant structures 98 and 104 are in parallel while the overall super resonant structure 115 is coupled at one end to the base of the transistor Q1 and to the series capacitors C7 and Cv.

The dual crystal oscillator 90 of FIG. 5 is similar to the wideband VCXO single crystal embodiments shown above. With respect to the dual crystal oscillator 90, both the first and second crystals are chosen to be parallel resonant crystals. Inductances L2 and L4 are the two series inductances that may be individually added in series to a respective crystal (i.e. L2 with Xtal1 and L4 with Xtal2, respectively) in order to improve the pulling range of the individual crystals. The network or trimmer circuitry 110 may be inserted across the crystal 108 in order to linearize the tuning response (i.e. to make the frequency response of the resonant substructure 106 linear with respect to change in capacitor Cv). The overall tuning is accomplished by variation of capacitor Cv in a similar manner as in the single crystal VCXO.

Figure 9:
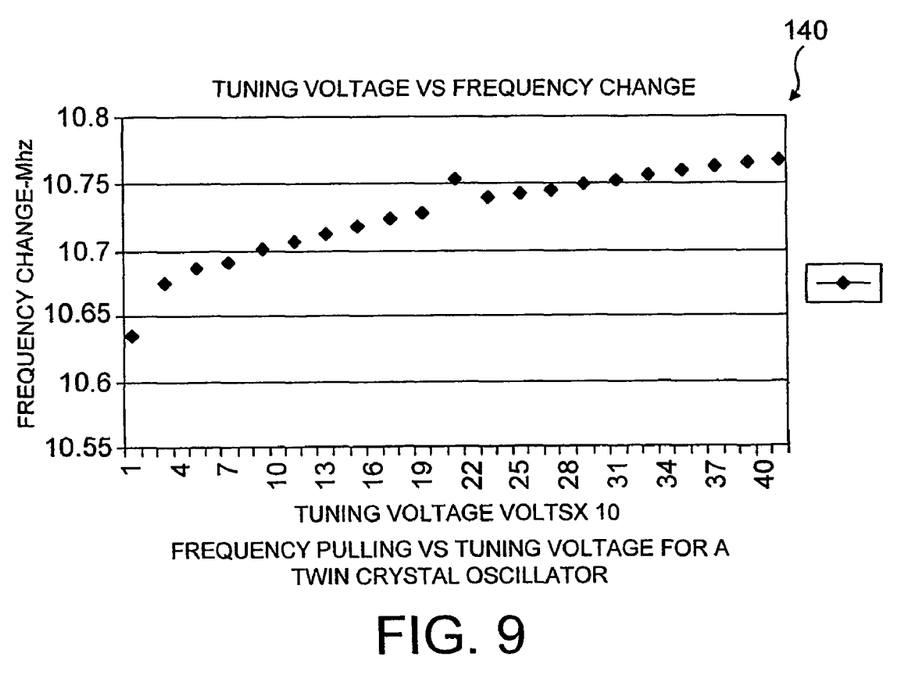
FIG. 9 is a graph depicting tuning voltage versus frequency change (pulling) for a dual crystal voltage controlled crystal oscillator.

More particularly, networks 100 and 106 are resonant at different frequencies, for example 10.63 MHz and 10.76 MHz. Capacitor C3 (capacitance) with respect to the network 106 provides a 90° phase shift between the networks 100 and 106 such that when the network 100 is at its lowest impedance, network 106 is at its highest impedance and vice versa. This ensures that both networks 100 and 106 interact at a minimum. Inductor L2 cancels the effect of capacitor C2, improving the tunability of the network 100 by the variation of C7, Cv and L3. Without the network R3, C6, and L5 (circuitry 110), the resonance circuits 100 and 106 tend to have sharp tuning characteristics that may impact tuning linearity. The circuitry 110 effectively reduces the "Q" of the crystal 108 by a factor of approximately 4–5. Typical crystals have a Q of 2000. Application of circuitry 110 reduces the Q of the circuit 106 to be between 400–500. This reduction of Q helps to transition from network 100 to network 106 without interruption or abruptness when Cv is varied. It is also possible with the present configuration to realize tuning linearity of better than 2–3% as shown in FIG. 9, without resorting to the use of complicated compensation circuits.

With respect to an application of the subject VCXO, in order to preserve the ssb (single side band) phase noise characteristics at lower and upper ends of the tuning range, two separate series inductors L2 and L4 are used in both networks 100 and 106 (i.e. both "arms" of the circuitry) in order to cancel the effect of capacitors C2 and C5 respectively. A measured SSB phase noise for the VCXO 90 at the lower end was −145 dbc/hz, with an upper end of −139 dbc/hz, giving a difference of 6 dbc/hz.

Figure 6:
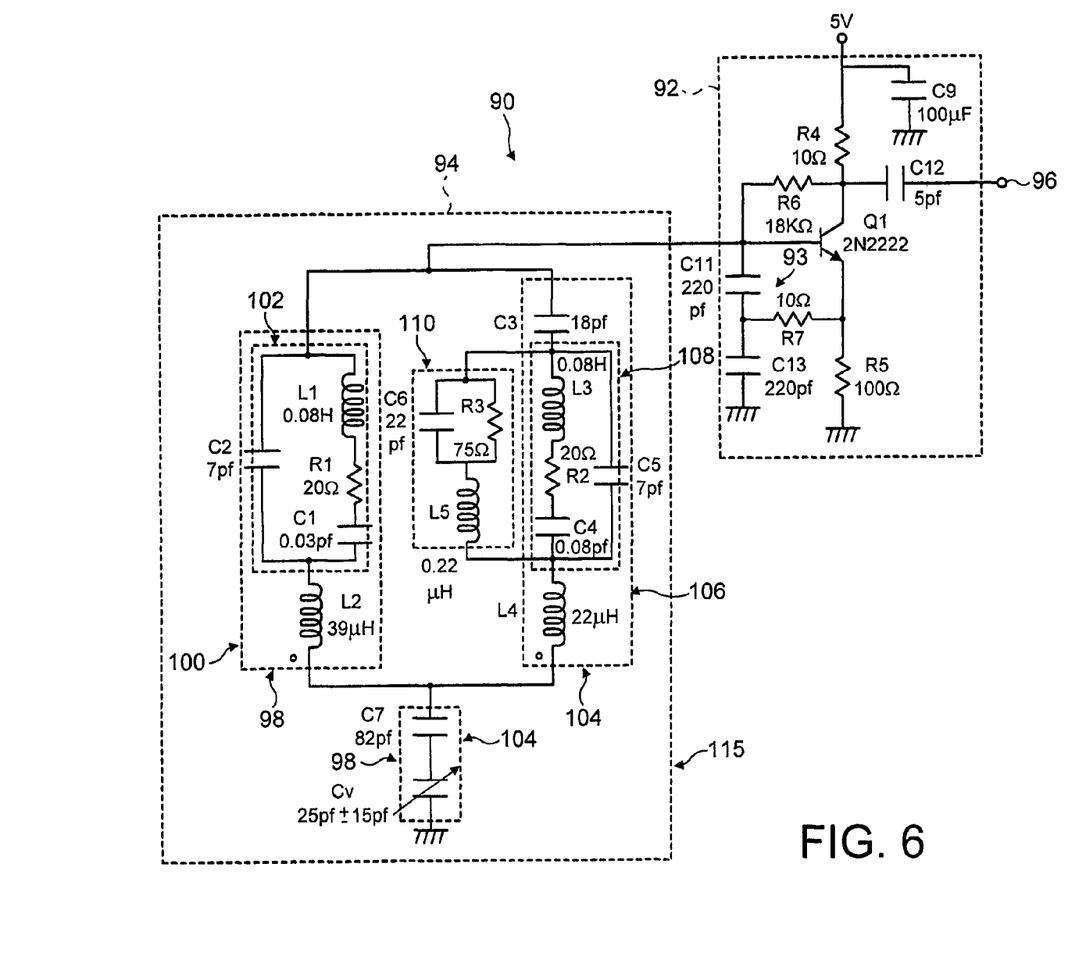
FIG. 6 is the electrical schematic diagram of FIG. 5 showing exemplary values for the various components.

Referring to FIG. 6, there is depicted the dual crystal oscillator 90 of FIG. 5 with exemplary values shown for the various components. It should be emphasized that the values are exemplary. As such, other values may be used depending on the crystals 102 and 108 chosen, the transistor Q1 chosen, and other components.

FIG. 7 depicts a graph, generally designated 120, of inductance Lx versus frequency pulling for the single crystal embodiment of FIG. 3. It can be seen, that the frequency can shift from approximately 50 KHz to approximately 300 KHz (a range of 250 KHz) utilizing inductances from 1 to 13 μH.

FIG. 7 shows the frequency pulling characteristics with respect to the value of Lx, the external series inductor. It can be seen that by controlling the value of this inductor, the tuning range can be increased or decreased. The specific range of inductance values for Lx is dependent on crystal case capacitance $C_{O1}$, $C_{O2}$. For an HC49 crystal as used in a prototype for one of the crystals of the networks 100 or 106, $C_{O1}$ is of the order of 7 picofarad (pf), whereas for a HC18 crystal as used in the prototype for one of the crystals of the other of the networks 100 or 106, $C_{O2}$ was of the order of 5 picofarads. The frequency tuning range can be quantified as being about 25 KHz per microhenry of inductance added.

Figure 8:
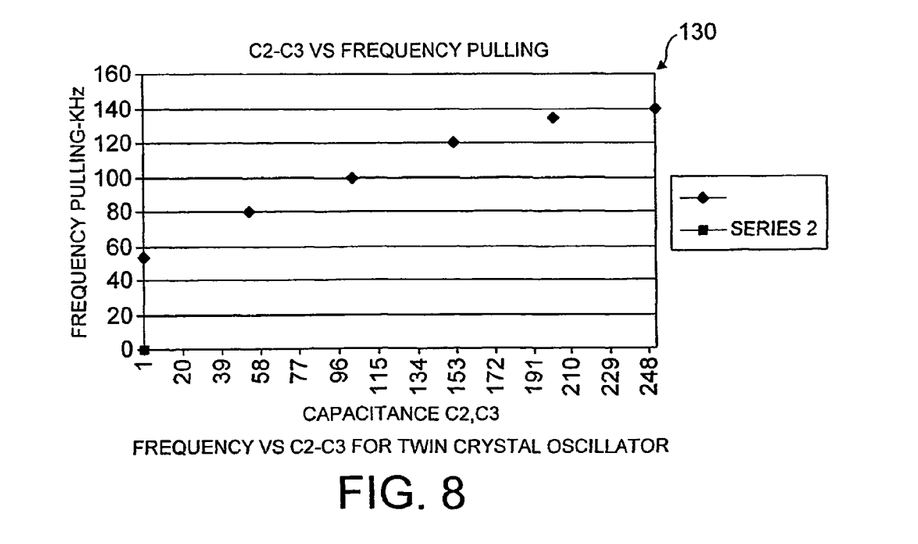
FIG. 8 is a graph depicting capacitance versus frequency pulling for a dual crystal voltage controlled crystal oscillator.

FIG. 8 depicts a graph, generally designated 130, showing the effect of the pair of capacitances C2, C3 (FIGS. 3 and 4) having equal values or of the pair of capacitances C11, C13 (FIGS. 5 and 6) having equal values on the frequency pulling for the single crystal or dual crystal oscillator (VCXO), respectively. It can be seen that the frequency can shift from approximately 60 KHz to 140 KHz (a range of 80 KHz) utilizing a capacitance that varies from 1 to 248 pf for each capacitance of the corresponding pair of capacitances.

Developing along similar lines as that of a single crystal with series inductance as described above, the pulling range for the dual or twin crystal embodiment described above can be computed with the following equation:

$$\frac{\Delta f}{f_c} = \frac{f_l - f_h}{f_c} \quad (13)$$

$$= \left[\frac{1}{2}\left(\frac{C01}{C11}\right)\right]\left[\frac{1}{1 + \frac{CL}{CO1}\{1 - \omega^2 Lx1_{CL}\}^{-1}}\right] +$$

$$\left[\frac{1}{2}\left(\frac{C02}{C12}\right)\right]\left[\frac{1}{1 + \frac{CL}{CO2}\{1 - \omega^2 Lx2_{CL}\}^{-1}}\right]$$

Where $C_{O1}$ is the parallel capacitance of the first crystal, $C_{11}$ is the series capacitance of the first crystal, $C_L$ is the load capacitance, $C_{O2}$ is the parallel capacitance of the second crystal and $C_{12}$ is the series capacitance of the first crystal and ω is the frequency of resonance of the tank circuit, and L2 and L4 are the series inductance with each of the crystals. Simulations were done with the following capacitance and inductance values for the crystals:

$C_{O1}$=2.5 pf;
$C_{O2}$=2.5 pf;
$C_{11}$=0.03 pf;
$C_{12}$=0.03 pf;
L1=0.08 H; and
L2=0.08 H.

The results of the simulation are plotted in FIG. 9. FIG. 9 depicts a graph, generally designated 140, of tuning voltage (times 10) versus frequency change (in MHz). It can be seen that the frequency change can shift from approximately 10.63 to 10.76 MHz as a result of tuning voltages from 0.1 volts to 4 volts that vary the value of capacitor Cv in a manner not shown. The chart 140 shows a 128 Khz variation in the Oscillator frequency. This corresponds to a frequency pulling of minimum 1.2 percent.

Figure 10:
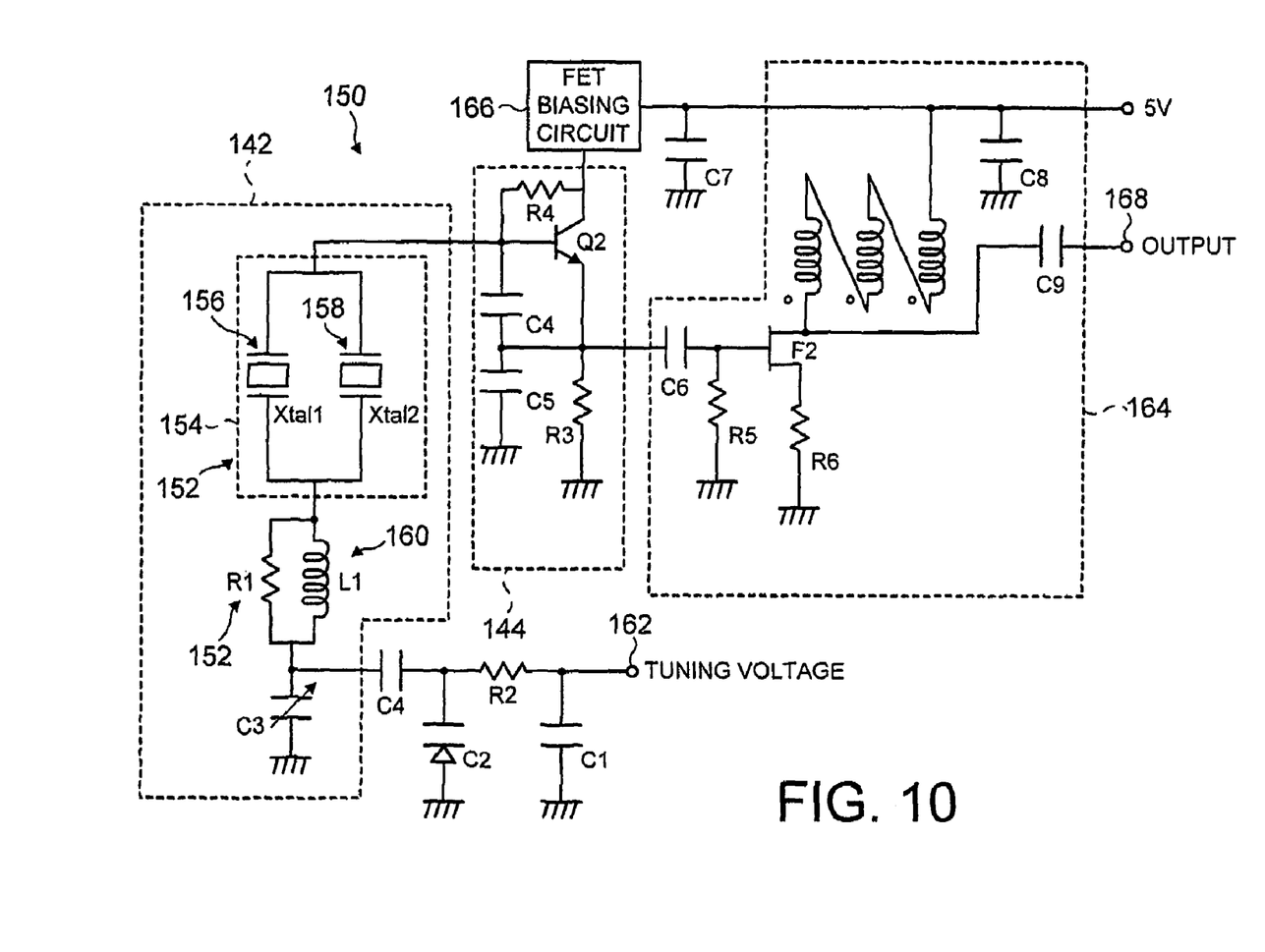
FIG. 10 is an electrical schematic diagram of another exemplary embodiment of a dual or twin crystal voltage controlled crystal oscillator in accordance with the principles of the subject invention.

Referring now to FIG. 10, there is depicted another exemplary embodiment of the subject invention. Particularly, there is depicted a VCXO, generally designated 150. In general, the VCXO 150 is a dual or twin crystal VCXO with the dual crystals disposed in parallel with a series inductance (inductor(s)) and voltage variable capacitance (capacitor(s)) in a feedback loop. In general, the VCXO 150 has two crystals connected in parallel, with fixed inductance L1, resistance Q1, and variable capacitance C3 in series to ground. The variable capacitance C3 is shunted by a voltage variable capacitor C2 to provide electronic tunability for the circuit. As such, the VCXO 150 is operative to provide stable frequency output over wide pulling ranges.

More particularly, the VCXO includes a crystal circuitry 142 and a transistor circuitry 144. The crystal and/or crystal circuitry/logic 142 includes a main resonant structure 152 formed by a crystal resonant structure 154 and a tuning or tank circuit 160. The crystal resonant structure 154 includes a first crystal Xtal1 and a second crystal Xtal2 disposed in parallel. The crystal resonant structure 154 is coupled at one end to the base of the transistor Q2 and at another end to the tuning structure 160. The tuning structure 160 includes inductance (as inductor L1) and resistance (as resistor R1). A tuning voltage injected from tuning voltage input 162 is input to the tuning circuit 160. The overall value of the resonant frequency of the tuning circuit 160 should match the resonant frequency of the crystal resonant structure 154. This composite network will resonate and allow a low impedance at the base of the transistor Q2. Pulling of the system is accomplished with R1 and L1. R1 and L1 form a resonance circuit with C3 and/or the internal parasitic capacitance of the crystals.

Further, the transistor circuitry 144 of the VCXO 150 includes an NPN transistor Q2 forming a Colpitts oscillator. A voltage feed back ratio is decided by capacitors C4 and C5 (feedback network) which are typically of the same value. The output of the transistor and/or transistor circuitry/logic 144 is provided to conditioning circuitry/logic 164. The conditioning circuitry/logic 164 capacitively couples the transistor Q2 output by capacitor C6. This output is buffered by FET F2 and its associated amplifier circuitry/logic. The FET F2 and its associated amplifier circuitry/logic provide an output 168.

Analysis is made on the tunability improvements made possible by adjustment of feedback capacitor values and series inductance. Temperature compensation is provided to a bi-polar transistor by biasing the transistor using a FET device that has an inverse temperature characteristic. Typical tunability of prior art VCXOs is on the order of 0.05% of $F_0$ while the subject VCXO 150 is on the order of 1.2% of $F_0$, a 24 times improvement in tuning range.

In one form, the VCXO 150 provides temperature compensated for the oscillator. Particularly, in accordance with one embodiment of the subject invention, operating stability of the VCXO over various temperature ranges (e.g. −20° C. to +55° C.) is accomplished by utilizing a FET current source 166 to bias a bi-polar transistor of the oscillator. Since FET and bi-polar transistors have opposite temperature characteristics, the overall system will achieve the objective of stable performance over the temperature range. The FET biasing circuit 166 is a constant current source. Additionally the FET biasing circuit 166 provides a change in voltage with temperature that is opposite to the change in voltage with temperature of the transistor Q2. The circuits are complementary, thus aiding in operation thereof.

Stabilization of the performance of the subject VCXOs (output level and/or spectral characteristics), the VCXO output may be capacitively coupled using a capacitor C6 (e.g. 2–3 pf) and then buffered by a FET amplifier circuit (F2). This provides adequate isolation to the VCXO so that the output frequency and spectral properties remain relatively stable over varying load conditions.

The subject VCXOs are capable of pulling a 10 MHZ crystal better than 100 KHz. Tests were done with various values of inductance and capacitance with respect to the crystal resonant structure. Tests indicated that with inductance at 10 µH and capacitance at 440 pf (series capacitance of 220 pf each), very stable results are achieved. Tunability can be increased with inductance increased to 12 µH. With respect to single crystal VCXO implementation, the subject dual crystal has very good tunability over such traditional signal crystal implementations. With two crystals and changing inductance from 6 µH to 12 µH, there is improved tunability for the oscillator from 50 kHz to 275 kHz. With a single crystal, typically only a 2–3 kHz pulling range can be achieved. When feedback capacitance $C_2$, $C_3$ of FIG. 4 are selected at 220 pF, and the base to emitter feedback resistance R2 chosen to be 81 Kohms, and the series inductance Lx at 10 µH, it was found that the frequency pulling range of the single crystal resonant structure was improved from 50 kHz to 140 kHz. An 18 Kohm resistor R1 is preferably used as a shunt across L1 to ensure smooth tunability over the operating range.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and which fall within the limits of the appended claims.

What is claimed is:

1. A controlled crystal oscillator comprising:
   a first crystal having first and second terminals;
   a transistor having a base, the base being coupled to said first crystal to the first terminal to provide positive feedback, using a feedback loop, for generating an output oscillatory signal;
   a voltage divider having at least one capacitor which directly connects an emitter of the transistor to the base, the voltage divider being included in the feedback loop to permit feedback to maintain oscillation;
   a variable reactance coupled to said first crystal at the second terminal for producing a change in a frequency of said oscillatory signal when a corresponding change in said variable reactance occurs;
   a first inductance coupled in a resonant circuit that includes said variable reactance and said first crystal having a value selected to provide a pulling range of at least 0.4% with respect to said frequency of said oscillatory signal, and
   a second crystal coupled to said first crystal via said first inductance and included in said resonant circuit.

2. A controlled crystal oscillator according to claim 1, further comprising an energy dissipating impedance coupled to said first crystal for decreasing a Q characteristic of said first crystal wherein said first inductance separates said second crystal from said energy dissipating impedance.

3. A controlled crystal oscillator according to claim 1, wherein said variable reactance comprises a variable capacitance that is coupled to a junction terminal between said first and second crystals.

4. A controlled crystal oscillator according to claim 1, further comprising a second inductance coupled to said second crystal, wherein said variable reactance is coupled to a junction terminal between said first and second inductances.

5. A controlled crystal oscillator comprising:
   a first crystal;
   a second crystal coupled to said first crystal via said first inductance and included in said resonant circuit;
   a transistor coupled to said first crystal to provide positive feedback for generating an output oscillatory signal;
   a variable reactance coupled to said first crystal for producing a change in a frequency of said oscillatory signal when a corresponding change in said variable reactance occurs; and
   a first inductance coupled in a resonant circuit that includes said variable reactance and said first crystal having a value selected to provide a pulling range of at least 0.4% with respect to said frequency of said oscillatory signal.

6. The controlled crystal oscillator of claim 5, further comprising a capacitance disposed in series with a crystal resonant structure formed by the first crystal and the second crystal.

7. The voltage controlled crystal oscillator of claim 6, wherein said capacitance is variable.

8. The voltage controlled crystal oscillator of claim 5, further comprising a tank circuit disposed in parallel with said second crystal.

9. A controlled crystal oscillator according to claim 5, wherein said variable reactance comprises a variable capacitance that is coupled to a junction terminal between said first and second crystals.

* * * * *